(12) United States Patent
Shetty et al.

(10) Patent No.: US 11,765,870 B2
(45) Date of Patent: Sep. 19, 2023

(54) SOFTWARE-DEFINED INFRASTRUCTURE FOR IDENTIFYING AND REMEDIATING AN AIRFLOW DEFICIENCY SCENARIO ON A RACK DEVICE

(71) Applicant: Dell Products L.P., Round Rock, TX (US)

(72) Inventors: Harshendra Shetty, Bangalore (IN); Shivendra Katiyar, Bangalore (IN); Sandeep Venkatesh Pai, Bengaluru (IN); Nikhil S, Thiruvananthapuram (IN)

(73) Assignee: Dell Products L.P., Round Rock, TX (US)

( * ) Notice: Subject to any disclaimer, the term of this patent is extended or adjusted under 35 U.S.C. 154(b) by 162 days.

(21) Appl. No.: 17/476,548

(22) Filed: Sep. 16, 2021

(65) Prior Publication Data
US 2023/0083377 A1 Mar. 16, 2023

(51) Int. Cl.
| H05K 7/20 | (2006.01) |
| G05B 15/02 | (2006.01) |
| G06F 9/48 | (2006.01) |
| G06F 9/50 | (2006.01) |

(52) U.S. Cl.
CPC ......... *H05K 7/20836* (2013.01); *G05B 15/02* (2013.01); *G06F 9/4856* (2013.01); *G06F 9/5094* (2013.01); *H05K 7/20736* (2013.01)

(58) Field of Classification Search
USPC ....................................................... 700/282
See application file for complete search history.

(56) References Cited

U.S. PATENT DOCUMENTS

| | | | | |
|---|---|---|---|---|
| 2009/0138313 | A1* | 5/2009 | Morgan | H05K 7/2079 705/7.23 |
| 2009/0296342 | A1* | 12/2009 | Matteson | G06F 1/206 361/679.46 |
| 2011/0220324 | A1* | 9/2011 | Lindenstruth | E04H 5/02 165/104.19 |
| 2015/0253794 | A1* | 9/2015 | Palmer | H05K 7/1498 700/297 |
| 2017/0311477 | A1* | 10/2017 | Kunnathur Ragupathi | H05K 7/20836 |

* cited by examiner

*Primary Examiner* — Emilio J Saavedra
(74) *Attorney, Agent, or Firm* — Kirton McConkie; Brian Tucker

(57) ABSTRACT

A software-defined infrastructure can identify and remediate an airflow deficiency scenario on a rack device. A rack device manager can be configured to discover rack devices and create a representation of their physical locations. The rack device manager can also be configured to periodically retrieve airflow metrics of the rack devices to calculate an estimated airflow for each rack device. The rack device manager can use the estimated airflows and the airflow metrics to generate a rack device classifier for each rack device. Using these rack device classifiers, the rack device manager can detect when rack devices are experiencing airflow deficiencies and attempt to automatically remediate such deficiencies.

20 Claims, 13 Drawing Sheets

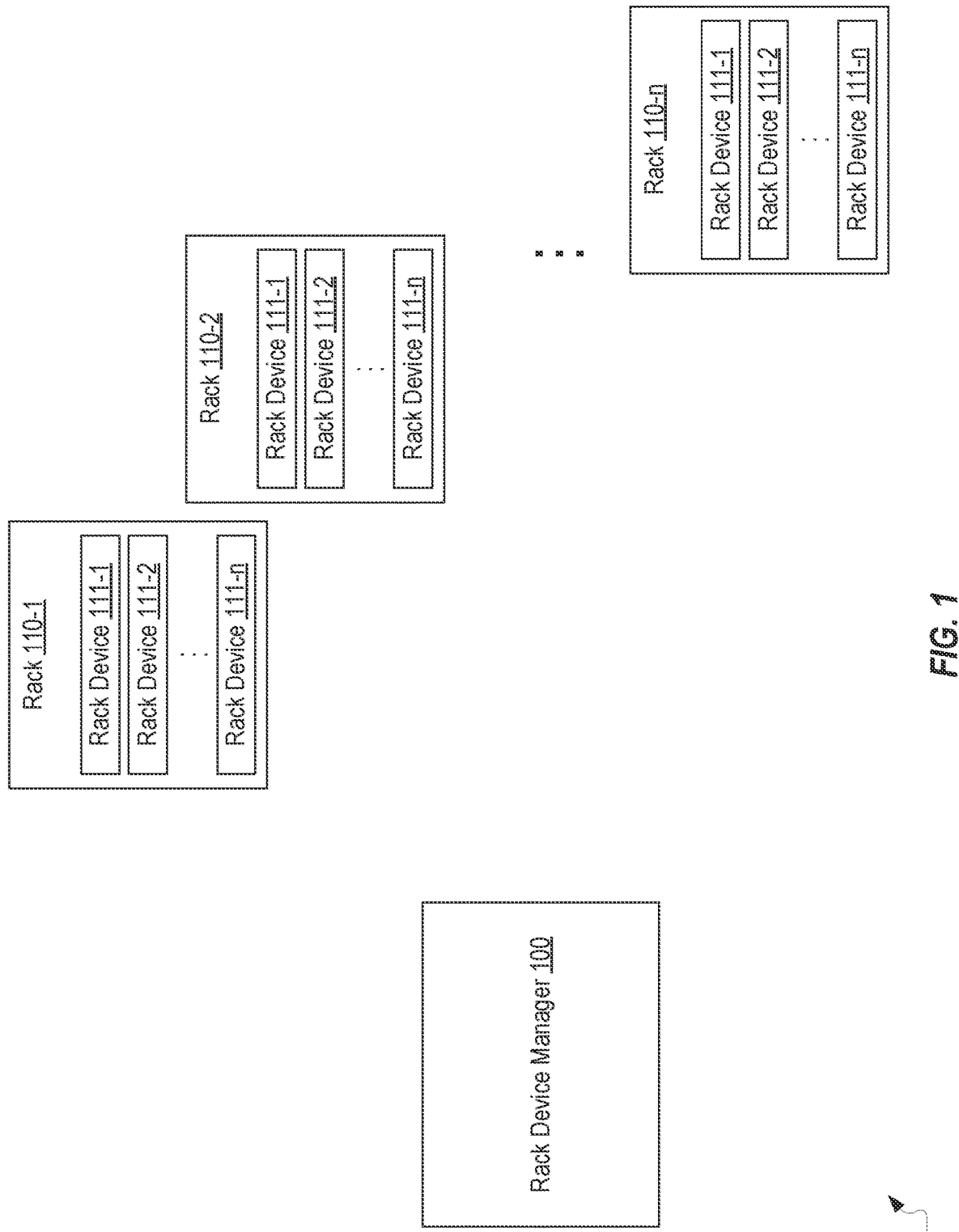

SOFTWARE-DEFINED INFRASTRUCTURE FOR IDENTIFYING AND REMEDIATING AN AIRFLOW DEFICIENCY SCENARIO ON A RACK DEVICE

CROSS-REFERENCE TO RELATED APPLICATIONS

N/A

BACKGROUND

A server rack, or simply "rack," is a structure for housing servers and other electronic equipment such as networking devices. A "rack device" is any electronic device, such as a server, that may be housed in a rack. Racks are oftentimes located in data centers or other dedicated rooms where the environment can be controlled to prevent overheating of the rack devices. For example, a data center may have a dedicated cooling system to ensure that the ambient air temperature remains sufficiently cool to minimize the risk of overheating.

Even when the environment in which a rack is located may be adequately controlled, it is still important to provide airflow to each rack device. For this reason, most rack devices include fans or other mechanisms for inducing airflow through or along the rack devices. However, airflow can still be inhibited for various reasons. For example, if a physical obstruction, such as a sticky note, is placed on the front bezel of a rack device, which is where the air intake vents are typically located, the airflow pattern can be altered thus causing hot air to recirculate in the rack device. A similar result may occur if a physical obstruction is placed on the rack's door in front of a rack device.

As another example, one rack device's airflow can be reduced due to a neighboring rack device's airflow. For example, when a neighboring rack device is inducing excessive air intake, it can create an air void in front of the rack device. In such a case, even when the rack device's fan is running, it may not be able to induce sufficient airflow to cool the rack device due to the air void.

As a further example, even when there may be sufficient airflow for each rack device, if the ambient air temperature is inadequately controlled, the rack devices may still overheat. For example, if the intake air is already hot, it will provide minimal cooling to the rack device.

Various solutions exist for monitoring a rack device's temperature, airflow and other metrics. For example, some rack devices are configured to control the fan speed based on air temperature, power consumption or other metrics. However, with such solutions, if increases in fan speed do not adequately cool the rack device, it will be necessary to manually inspect the rack device to determine why inadequate cooling is occurring. During such manual inspections, it is relatively easy to identify a physical obstruction but rather difficult to identify an air void. Accordingly, even with existing solutions and manual inspections, it can be difficult to manage the cooling of rack devices.

BRIEF SUMMARY

The present invention extends to systems, methods and computer program products for providing a software-defined infrastructure for identifying and remediating an airflow deficiency scenario on a rack device. A rack device manager can be configured to discover rack devices and create a representation of their physical locations. The rack device manager can also be configured to periodically retrieve airflow metrics of the rack devices to calculate an estimated airflow for each rack device. The rack device manager can use the estimated airflows and the airflow metrics to generate a rack device classifier for each rack device. Using these rack device classifiers, the rack device manager can detect when rack devices are experiencing airflow deficiencies and attempt to automatically remediate such deficiencies.

In some embodiments, the present invention may be implemented as a method for identifying and remediating an airflow deficiency scenario on a rack device. It can be detected that a first rack device is experiencing an airflow deficiency scenario. It can then be determined that a second rack device is a neighbor to the first rack device and has excess airflow. One or more actions can then be automatically performed to remediate the airflow deficiency scenario.

In some embodiments, the present invention may be implemented as computer storage media storing computer executable instructions which when executed implement a method for identifying and remediating an airflow deficiency scenario on a rack device. Airflow metrics can be obtained from a plurality of rack devices. A rack device classifier can be generated for each of the plurality of rack devices based on the respective airflow metrics. An airflow deficiency scenario can be identified on at least one of the plurality of rack devices based on the respective rack device classifier. One or more actions can be performed to automatically remediate the airflow deficiency scenario.

In some embodiments, the present invention may be implemented as a system for identifying and remediating an airflow deficiency scenario on a rack device. The system may include one or more processors and one or more computer storage media storing computer executable instructions which when executed by the one or more processors implement a method for identifying and remediating an airflow deficiency scenario on a rack device. A rack device classifier can be generated for each of the plurality of rack devices in a rack. It can be determined that the rack device classifier generated for a first rack device of the plurality of rack devices is indicative of an airflow deficiency scenario. It can also be determined that a second rack device of the plurality of rack devices is a neighbor of the first rack device. One or more actions can then be performed on the second rack device to automatically remediate the airflow deficiency scenario.

This summary is provided to introduce a selection of concepts in a simplified form that are further described below in the Detailed Description. This Summary is not intended to identify key features or essential features of the claimed subject matter.

BRIEF DESCRIPTION OF THE DRAWINGS

Understanding that these drawings depict only typical embodiments of the invention and are not therefore to be considered limiting of its scope, the invention will be described and explained with additional specificity and detail through the use of the accompanying drawings in which:

FIG. 1 illustrates an example computing environment in which embodiments of the present invention could be implemented;

DETAILED DESCRIPTION

FIG. 1 illustrates an example computing environment 10 in which embodiments of the present invention could be implemented. Computing environment 10 includes a rack device manager 100 and some number of racks 110-1 through 110-n (individually or collectively rack(s) 110).

Each rack 110 can include a number of rack devices 111-1 through 111-n (individually and collectively rack device(s) 111). Rack devices 111 could represent any type of device that may be housed in rack 110. For example, in some embodiments, devices 111 could all be servers. As another example, in some embodiments, devices 111 could include one or more network devices such as switches, hubs, routers, modems, etc. Rack device manager 100 may be in the form of a service or other type of software component that runs on a computing device that has access to devices 111 in each rack 110. Rack device manager 100 can be configured to identify and remediate an airflow deficiency scenario on any of rack devices 111.

Figure 2A:
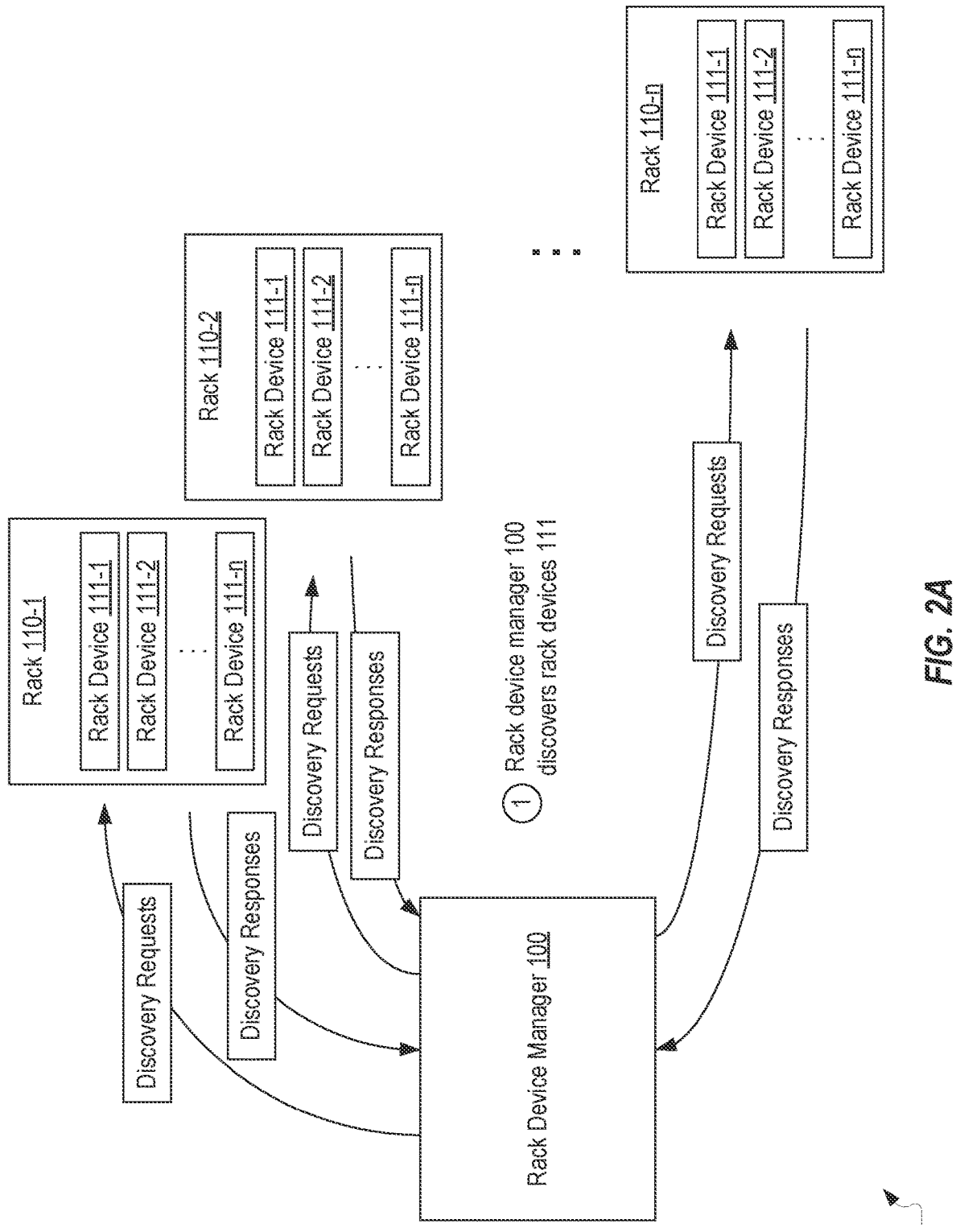
FIGS. 2A-2C provide an example of how a rack device manager may identify rack devices for which the rack device manager will provide airflow management.
Figure 2B:
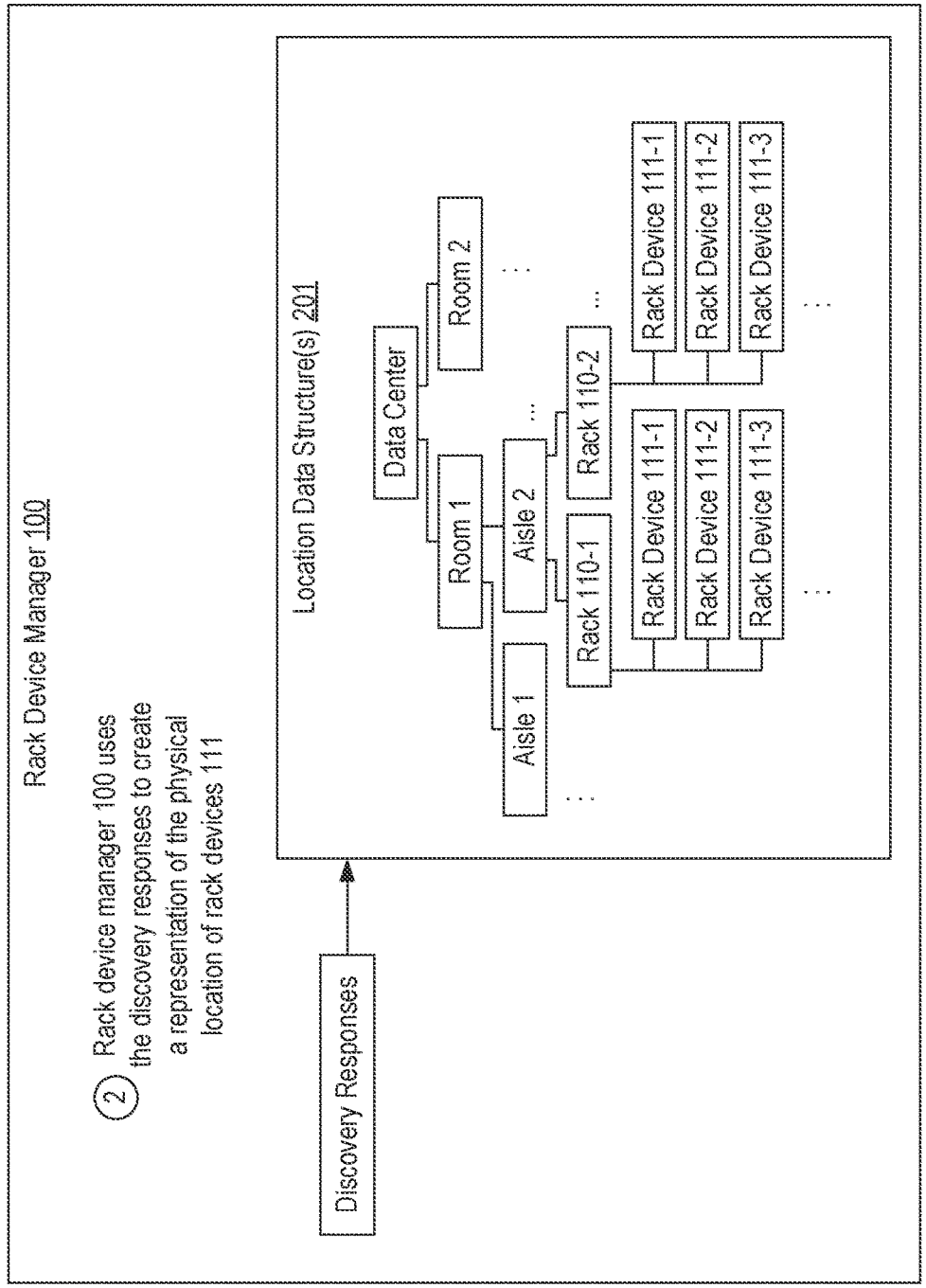
Figure 2C:
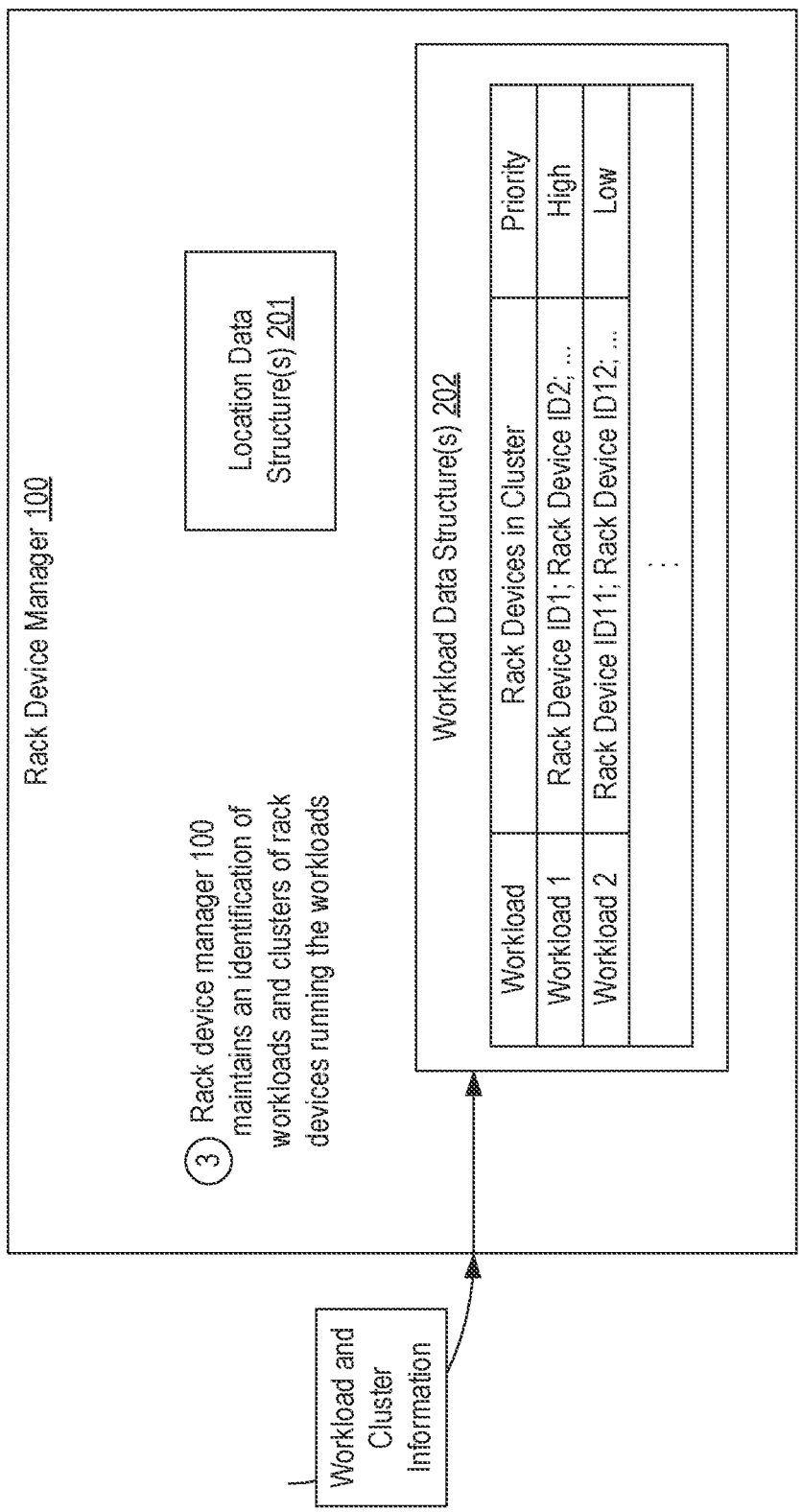

FIGS. 2A-2C provide an example of functionality that rack device manager 100 may perform to identify rack devices for which it will provide airflow management. In some embodiments, an administrator may use an interface provided by rack device manager 100 to cause at least some of the depicted functionality to be performed. Turning to FIG. 2A, in step 1, rack device manager 100 may discover rack devices 111 for which it may provide airflow management. For example, an administrator may interface with rack device manager 100 to cause rack device manager 100 to use a discovery tool (e.g., Dell EMC's OpenManage Enterprise systems management console) to issue discovery requests to each rack device 111 (and possibly each rack 110) in a datacenter or other location. As a result, rack device manager 100 can receive discovery responses from rack devices 111 containing information about each rack device (e.g., an identifier of the rack device, an IP address, etc.).

Turning to FIG. 2B, in step 2, rack device manager 100 may use the discovery responses (or other input containing similar information about rack devices 111) to create a representation of the physical location of rack devices 111. For example, rack device manager 100 may create one or more location data structures 201 that define a hierarchical representation of a datacenter, rooms within the datacenter, aisles within rooms, racks in aisles, and rack devices in racks. In some embodiments, an administrator may employ a tool such as the OpenManage Enterprise Power Manager as part of creating location data structure(s) 201.

Turning to FIG. 2C, in step 3, rack device manager 100 can maintain an identification of workloads and clusters of rack devices 111 that run the workloads. For example, rack device manager 100 could receive workload and cluster information in any suitable manner, including manual input, and create one or more workload data structures 202 which identify each workload, which rack devices 111 form a cluster for hosting the workload and a priority of the workload.

At this point, rack device manager 100 will have location data structure(s) 201 which it may use to determine where a rack device 111 is physically located, including determining which rack devices 111 are located next to one another, and will have workload data structure(s) 202 which it may use to determine which rack devices 111 form a cluster for hosting a particular workload. Rack device manager 100 may update location data structure(s) 201 and/or workload data structure(s) 202 periodically or as appropriate to reflect a current location/state of rack devices 111 and the workloads they host.

Figure 3A:
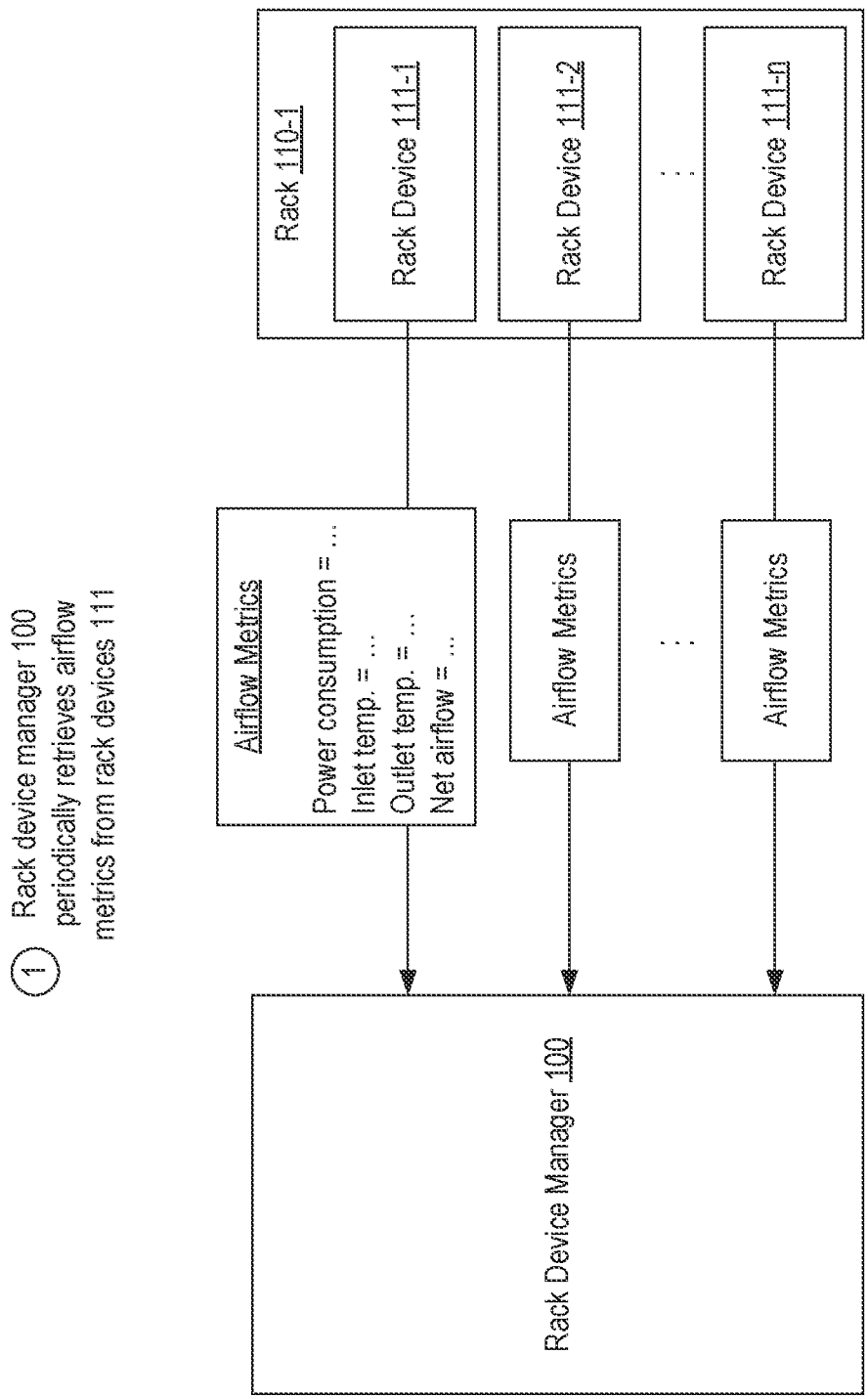
FIGS. 3A-3C provide an example of how a rack device manager can generate a rack device classifier for each rack device that it manages.
Figure 3B:
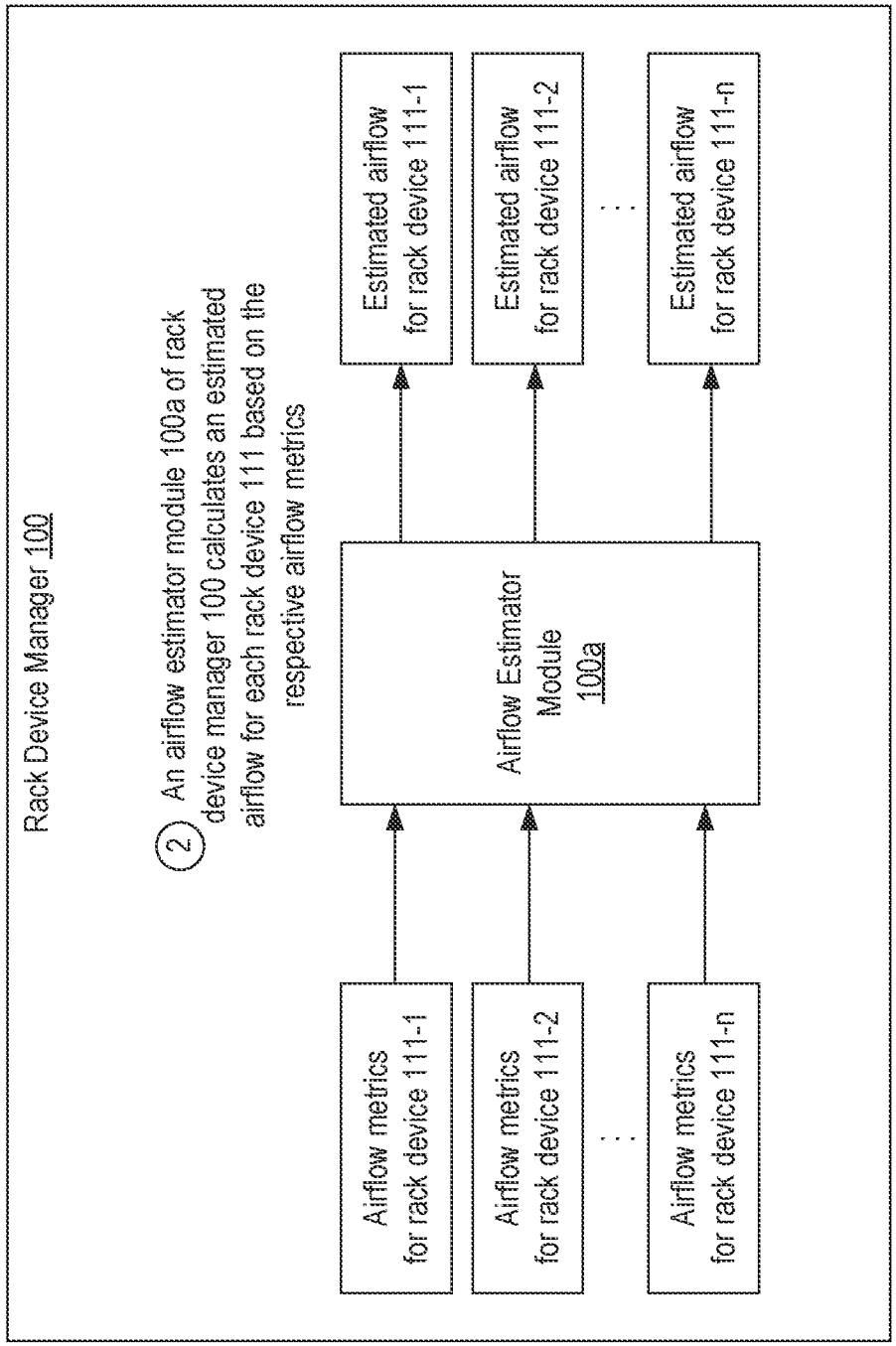
Figure 3C:
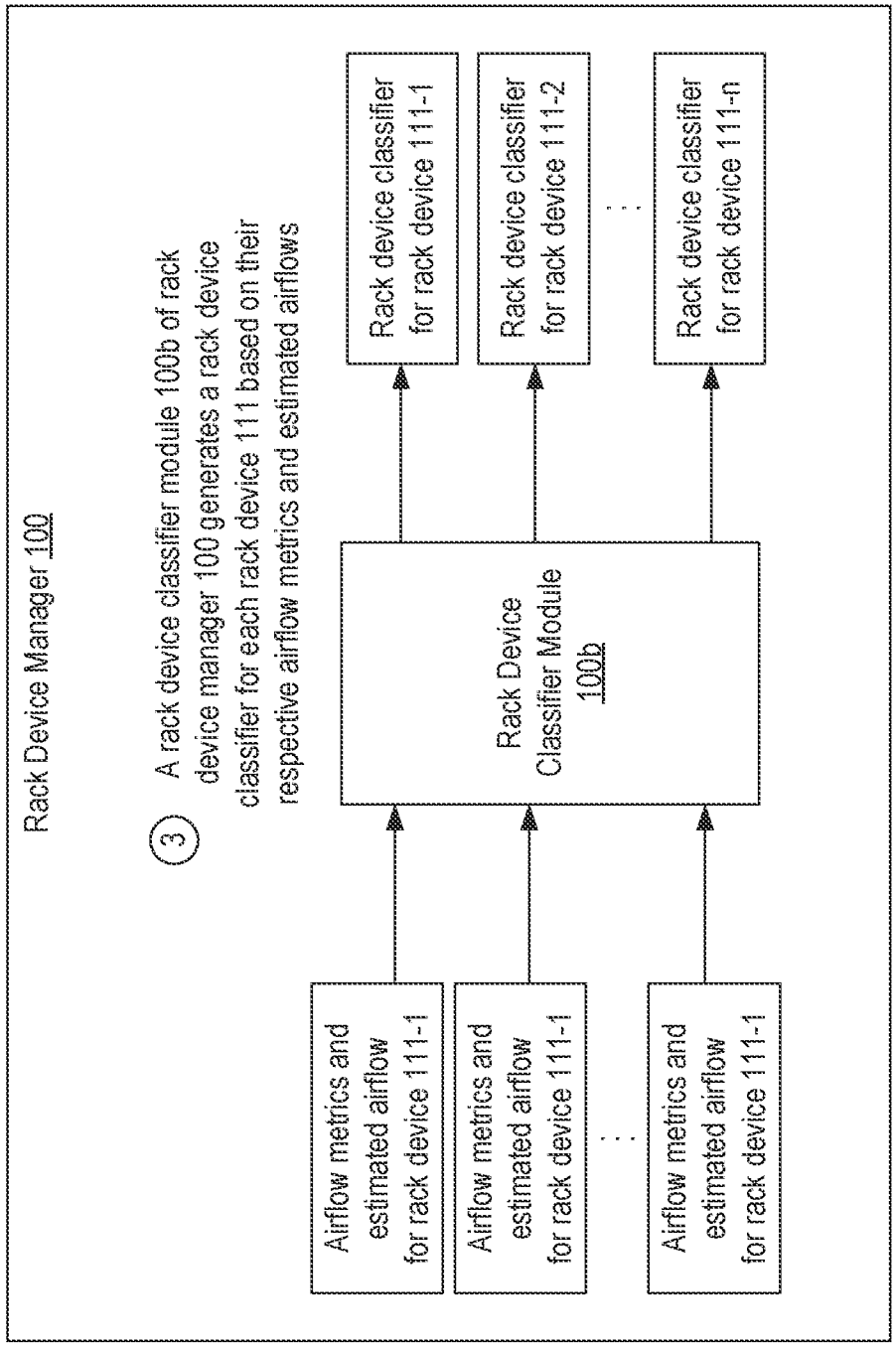

FIGS. 3A-3C provide an example of how rack device manager 100 may generate a rack device classifier for each rack device 111 for which it manages airflow. Rack device manager 100 may use these rack device classifiers to determine how to remediate an airflow deficiency scenario.

Turning to FIG. 3A, in step 1, rack device manager 100 can periodically retrieve airflow metrics for rack devices 111. In FIG. 3A, only one rack 110-1 is shown to simplify the illustration. In some embodiments, the airflow metrics can include one or more of a power consumption of the rack device, an inlet temperature of the rack device, an exhaust temperature of the rack device and/or a net airflow of the rack device. Rack device manager 100 may use any suitable management interface to retrieve the airflow metrics.

Turning to FIG. 3B, in step 2, rack device manager 100 may employ an airflow estimator module 100a to calculate an estimated airflow for each rack device 111 based on the respective airflow metrics. In some embodiments, the estimated airflow can be calculated using the power consumption and the difference between the inlet and exhaust temperatures such as:

Estimated Airflow (CFM)=$M$*(Power Consumption)/
(Exhaust Temp−Inlet Temp)

where Power Consumption is in watts and M is a multiplier having a value that depends on whether the temperatures are in Fahrenheit or Celsius. For example, M may be 3.2 for Fahrenheit and 1.78 for Celsius.

In cases where the airflow metrics include the power consumption but not the inlet and exhaust temperatures of the rack device 111, airflow estimator module 100a could calculate the estimated airflow based on the power consumption alone such as:

Estimated Airflow (CFM)=9*(Power Consumption)/
100

Accordingly, the estimated airflow for a rack device 111 is an estimate of the airflow at the rack device based on the rack device's power consumption and inlet and exhaust temperatures or based on the rack device's power consumption alone.

Turning to FIG. 3C, in step 3, rack device manager 100 may employ a rack device classifier module 100b to generate a rack device classifier for each rack device 111 based on their respective airflow metrics and estimated airflows. In some embodiments, a rack device classifier may be generated based on two parameters, an airflow deficiency parameter ($\Delta$Airflow) and a power headroom parameter ($\Delta$Power) which may be calculated as follows:

$\Delta$Airflow=Estimated Airflow−Net Airflow $\Delta$Power=Maximum Power Threshold−Power Consumption where the maximum power threshold can be a defined maximum power that the rack device is allowed to consume.

Figure 4:
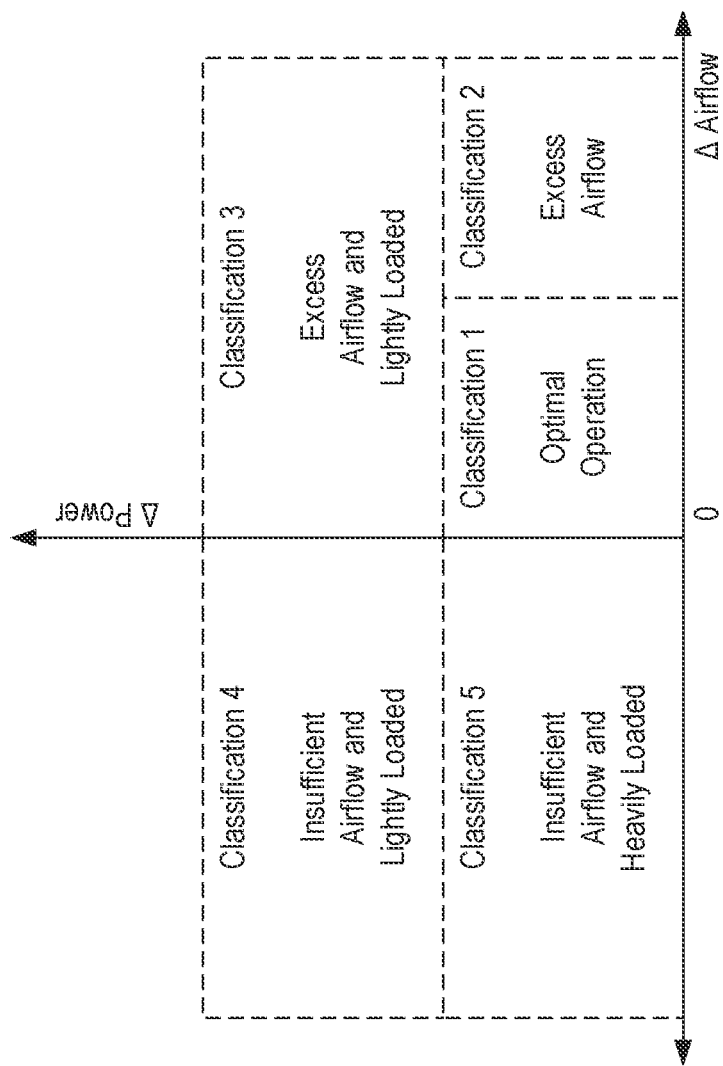
FIG. 4 provides an example of classifications that a rack device classifier may have.

FIG. 4 provides an example of how rack device classifier module 100b may use the airflow deficiency parameter and the power headroom parameter to generate a rack device classifier. As shown, the rack device classifier for a rack device 111 could be set to one of five classifications. The rack device classifier may fall in classification 1 when the airflow deficiency parameter is between 0 and a positive threshold and the power headroom parameter is below a threshold. Classification 1 represents optimal operation because the rack device is heavily loaded and its airflow is appropriate for the load.

The rack device classifier may fall in classification 2 when the airflow deficiency parameter exceeds the positive threshold but the power headroom parameter is below the threshold. Classification 2 therefore represents a scenario where the rack device may be heavily loaded but its airflow is still excessive.

The rack device classifier may fall in classification 3 when the airflow deficiency parameter is not negative and the power headroom parameter is above the threshold. Classification 3 therefore represents a scenario where the rack device is underutilized and has excessive airflow.

The rack device classifier may fall in classification 4 when the airflow deficiency parameter is negative and the power headroom parameter is above the threshold. Classification 4 therefore represents a scenario where the rack device is underutilized and has insufficient airflow.

The rack device classifier may fall in classification 5 when the airflow deficiency parameter is negative and the power headroom parameter is below the threshold. Classification 5 therefore represents a scenario where the rack device is heavily loaded and has insufficient airflow.

In the example provided in FIG. 4, classifications 4 and 5 represent a possible airflow deficiency scenario. However, other schemes could be used for the rack device classifier. In any case, rack device manager 100 can generate the rack device classifiers so that it may use them to determine how to remediate airflow deficiency scenarios.

FIGS. 5A-5E provide an example of how rack device manager 100 may attempt to remediate an airflow deficiency. Various actions are depicted in this example but not all actions need to be taken in any particular scenario. The example is intended to provide an overview of possible actions that rack device manager 100 may take when addressing airflow deficiencies that it may detect.

Figure 5A:
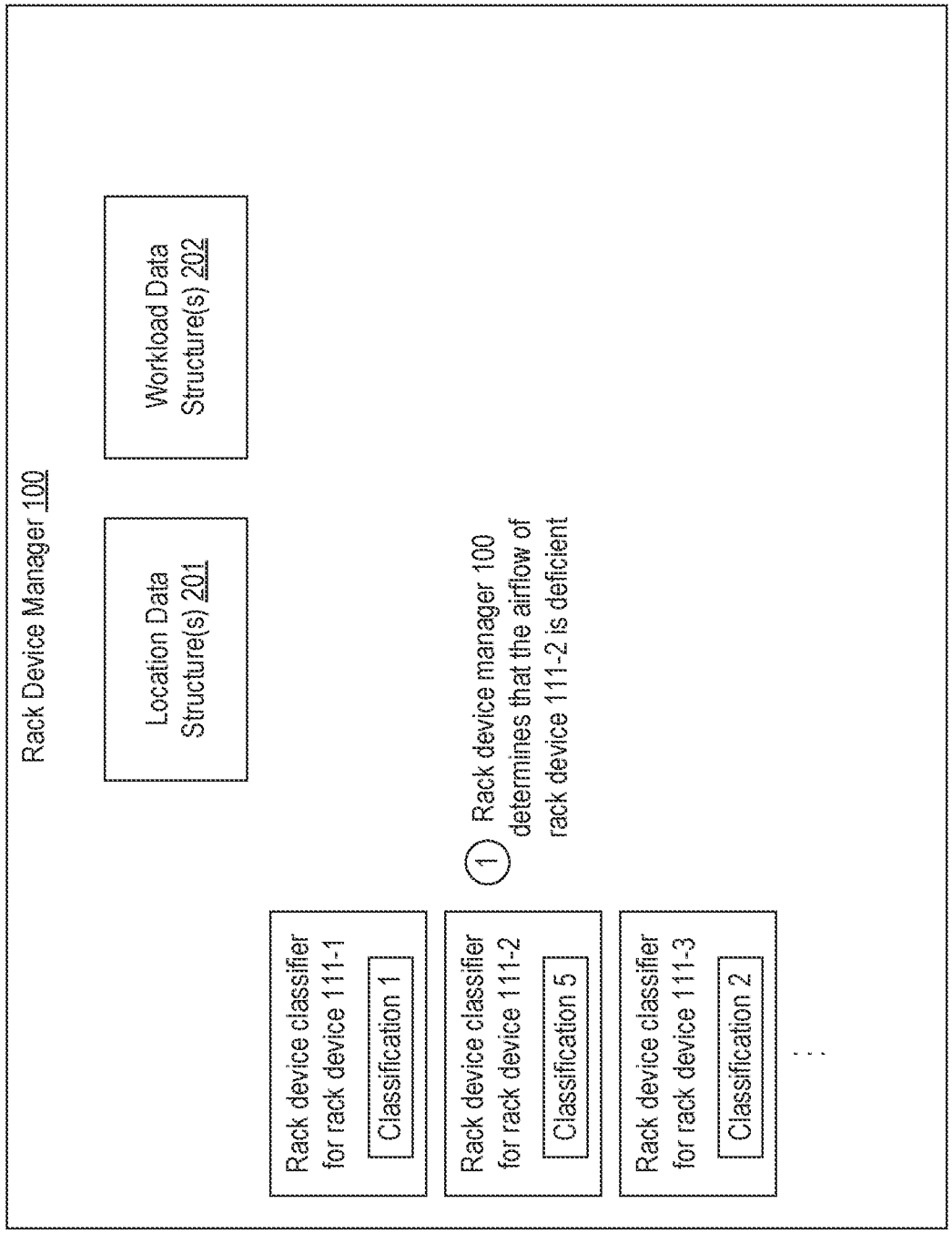
FIGS. 5A-5E provide an example of how a rack device manager may use the rack device classifiers to identify and remediate an airflow deficiency scenario.

Turning to FIG. 5A, it is assumed that rack devices 111-1 through 111-3 were assigned rack device classifiers of classification 1, classification 5 and classification 2 respectively. Based on these assumptions, in step 1, rack device manager 100 may determine that the airflow of rack device 111-2 is deficient. In particular, rack device manager 100 may determine that the rack device classifier it generated for rack device 111-2 is indicative of an airflow deficiency.

Figure 5B:
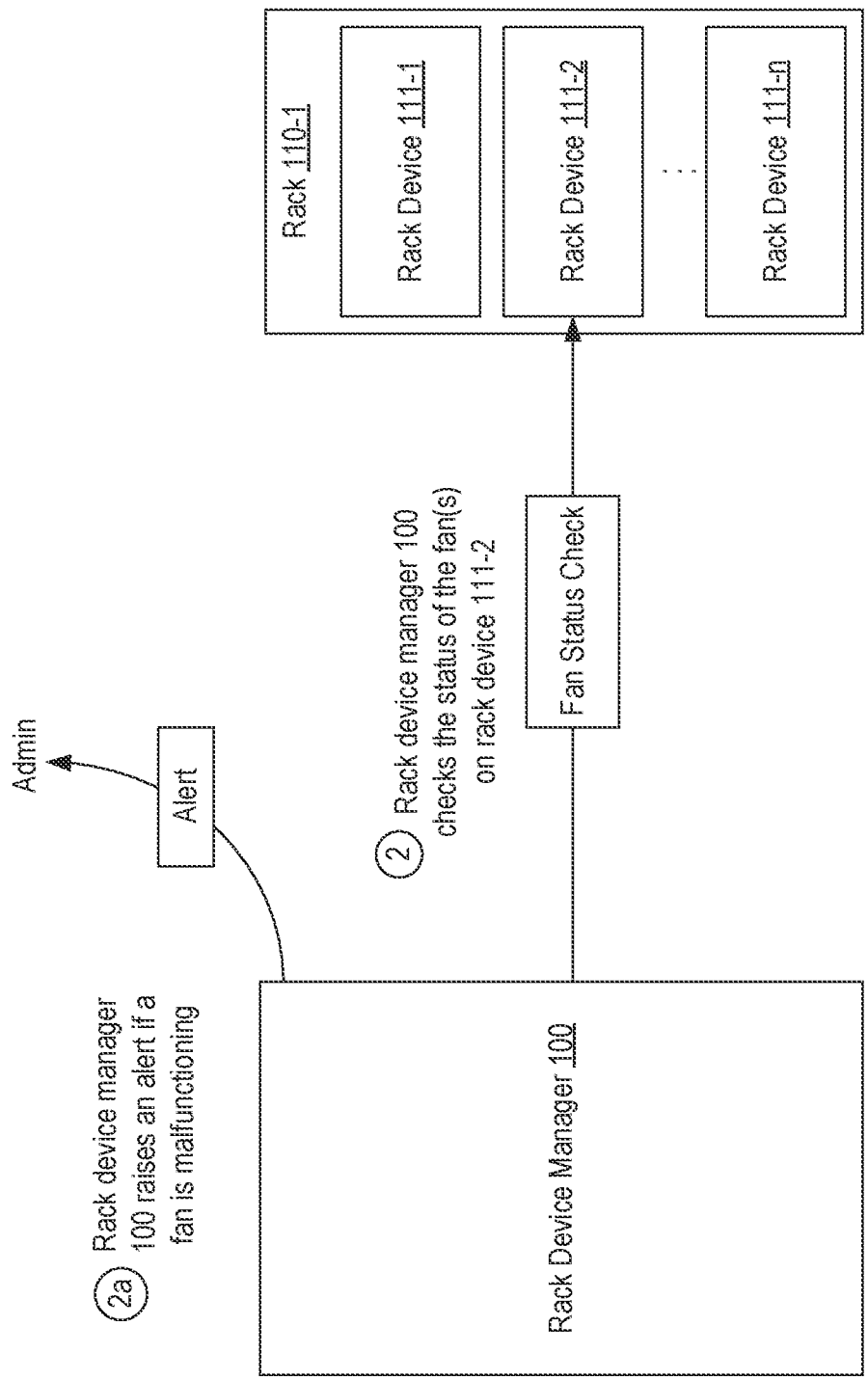

Turning to FIG. 5B, in step 2, rack device manager 100 may check the status of the fan(s) on rack device 111-2 in some embodiments. For example, rack device manager 100 may use an access control technique such as Dell's Integrated Remote Access Controller (iDRAC) to determine whether any fan on rack device 111-2 has malfunctioned. If so, rack device manager 100 may conclude that the airflow deficiency has been caused by the fan malfunction and may generate an alert in step 2a to complete the process of remediating the airflow deficiency scenario. However, if the fan(s) have not malfunctioned, rack device manager 100 can proceed with the process of attempting to automatically remediate the airflow deficiency.

Figure 5C:
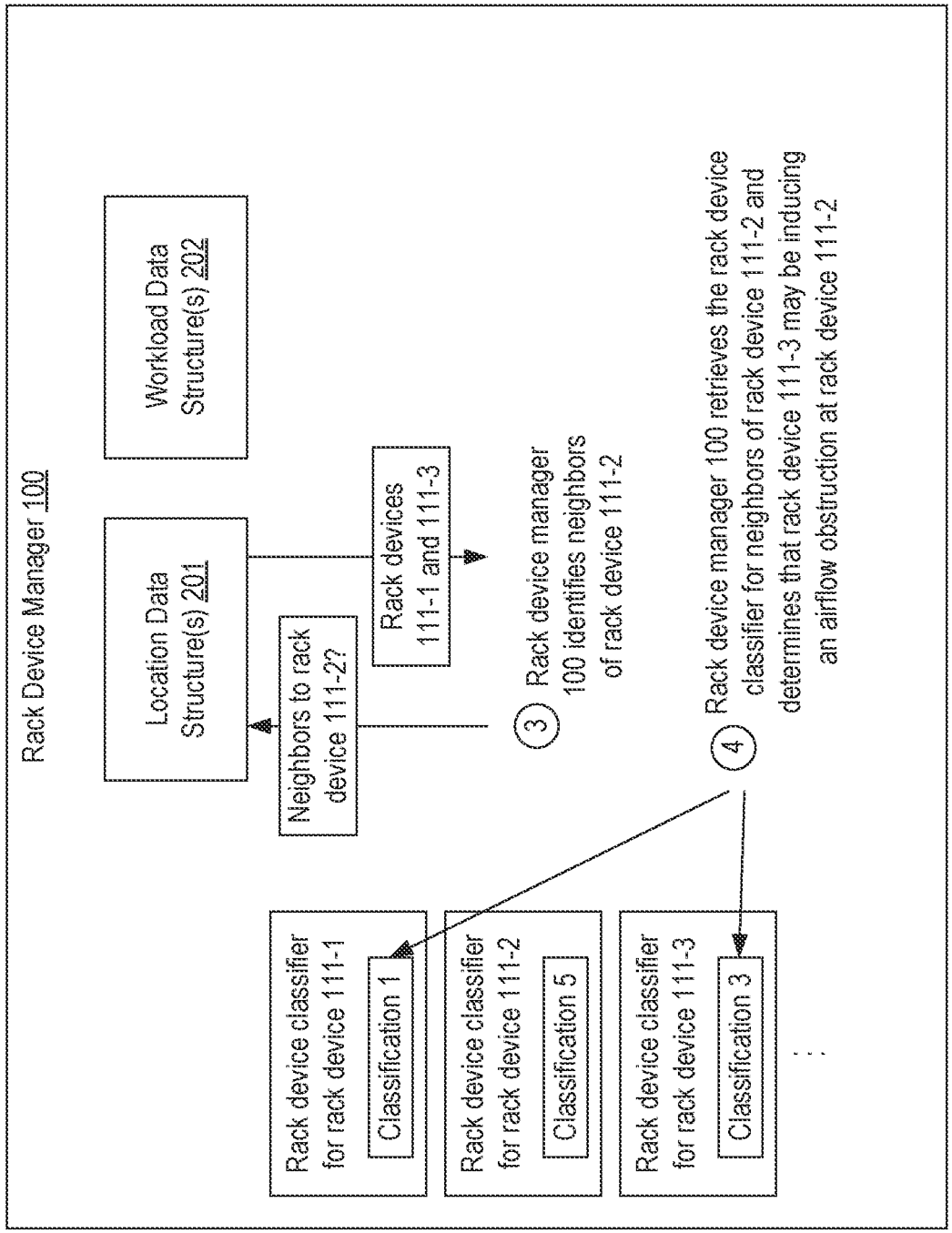

Turning to FIG. 5C, and assuming that the fan(s) on rack device 111-2 are functioning properly, in step 3, rack device manager 100 may identify which rack devices 111 are neighbors to rack device 111-2. For example, rack device manager 100 may access location data structure(s) 201 to identify which rack devices 111 are immediately adjacent rack device 111-2, which rack devices 111 are in the same rack as rack device 111-2, etc. In this example, it is assumed that rack device manager 100 determines that rack devices 111-1 and 111-3 are each immediately adjacent rack device 111-2 (e.g., above and below rack device 111-2). Therefore, in step 4, rack device manager 100 can retrieve the rack device classifier that it generated for rack devices 111-1 and 111-3 (or for any other neighbor of rack device 111-2). In this example, rack device manager 100 would determine that rack device 111-3 has a rack device classifier of classification 3 and, because this classification represents excess airflow at rack device 111-3, may determine that rack device 111-3 may be inducing the airflow deficiency in rack device 111-2 by creating an air void.

Figure 5D:
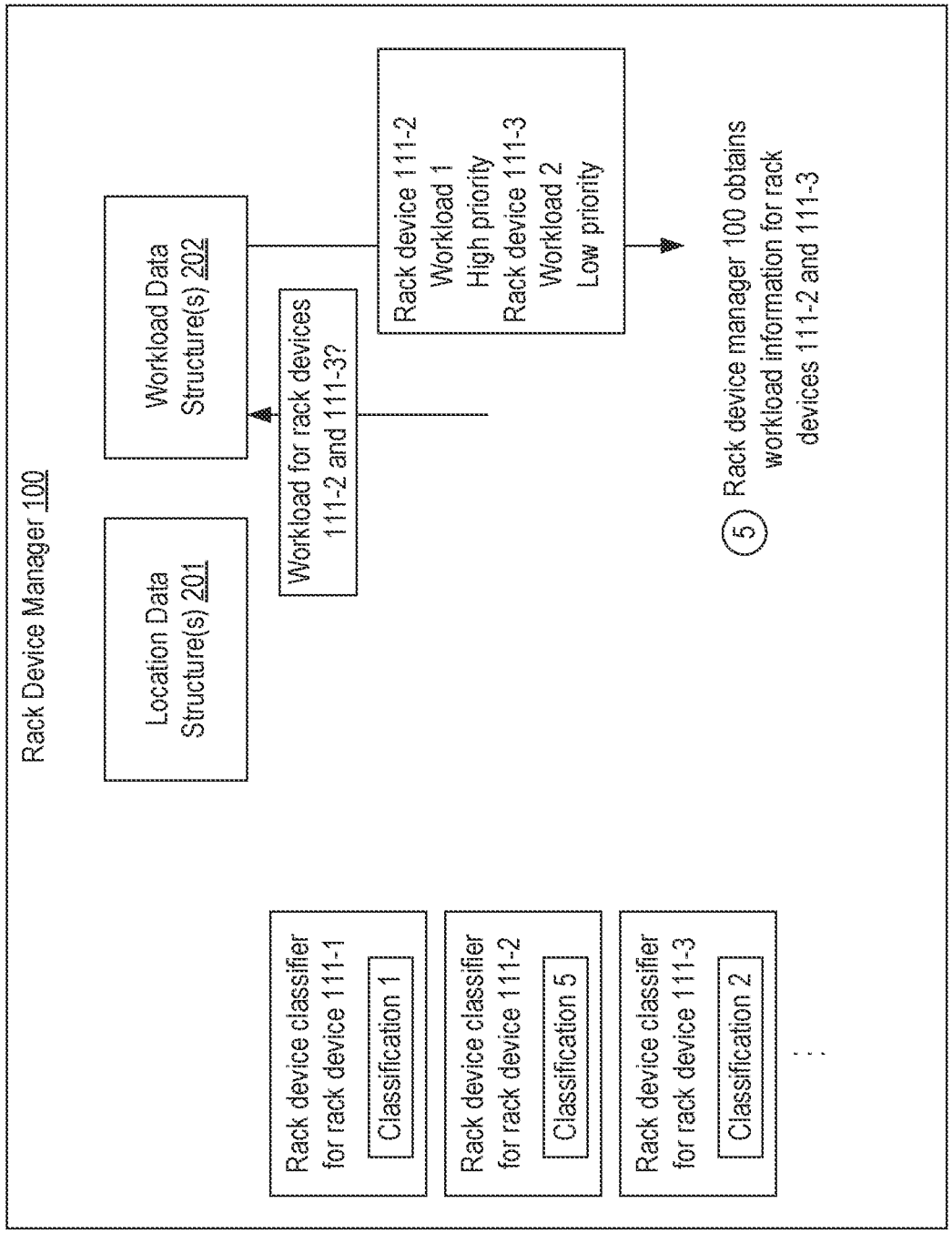

Turning to FIG. 5D, in step 5, rack device manager 100 can obtain workload information for rack devices 111-2 and 111-3. This step represents that rack device manager 100 may obtain workload information for a rack device 111 that is experiencing an airflow deficiency and for any neighboring rack device 111 that may be the cause of the airflow deficiency. Notably, there need not be a neighboring rack device 111 that may be causing an airflow deficiency. The rack device 111 experiencing the airflow deficiency may itself be the cause of the airflow deficiency. Also, in some scenarios, more than one neighboring rack device 111 or possibly all rack devices 111 in a rack 110 could be experiencing airflow deficiencies. Therefore, the depicted example should be considered as one of possibly many different airflow deficiency scenarios that could be addressed using the techniques of the present invention.

In this example, it is assumed that rack device 111-2 is hosting workload 1 which has a high priority, while rack device 111-3 is hosting workload 2 which has a low priority. Although not shown, as part of step 5, rack device manager 100 could also identify other rack devices 111 that are in the same cluster as rack device 111-2 or rack device 111-3. For example, rack device manager 100 could identify all rack devices 111 that are hosting workload 1.

Figure 5E:
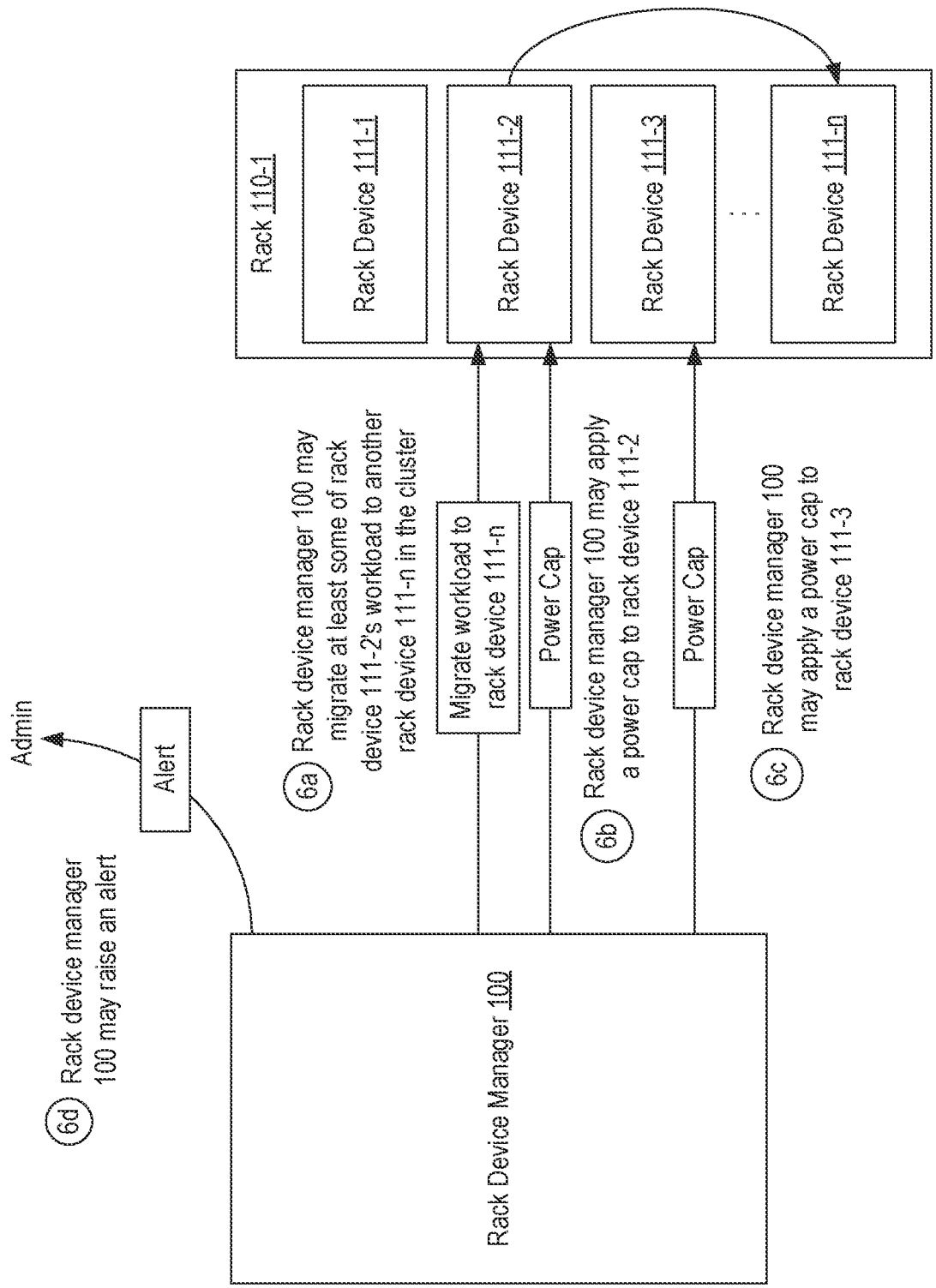

FIG. 5E provides various examples of actions that rack device manager 100 could take to attempt to remediate the airflow deficiency scenario that rack device 111-2 is experiencing. As one example, in step 6a, rack device manager 100 may migrate at least some of rack device 111-2's workload to another rack device 111 in the cluster, which is assumed to be rack device 111-n in this example. For example, rack device manager 100 could determine, from the rack device classifier generated for rack device 111-n, that rack device 111-n is lightly loaded and has sufficient airflow (e.g., if its rack device classifier were classification 3). In such a case, rack device manager 100 could migrate some of rack device 111-2's load pertaining to workload 1 to rack device 111-n to thereby cause rack device 111-2's power consumption to be reduced which may in turn cause its current airflow to be adequate.

As another example, in step 6b, rack device manager 100 may apply a power cap to rack device 111-2. By applying a power cap to rack device 111-2, rack device manager 100 could cause the current airflow to be adequate for rack device 111-2. In some embodiments, rack device manager 100 may apply a power cap to a neighboring rack device 111 only when the neighboring rack device 111 is hosting a workload that does not have a high priority or otherwise based on the priority of the workload.

As another example, in step 6c, rack device manager 100 may apply a power cap to rack device 111-3. By applying a power cap to rack device 111-3, rack device manager 100 could cause rack device 111-3 to reduce its airflow which may in turn remediate the airflow deficiency at rack device 111-2 (e.g., by eliminating an air void in front of rack device 111-2).

Rack device manager 100 could take any or all of the example actions represented in steps 6a-6c to attempt to remediate the airflow deficiency at rack device 111-2. Rack device manager 100 could perform such actions at the same time or sequentially.

Although not depicted, in some embodiments, rack device manager 100 could automatically interface with a cooling system to adjust the ambient air temperature within a room such as when rack device manager 100 determines that all or most rack devices 111 in the room are experiencing airflow deficiencies and/or when the intake air temperature is too high.

If none of these automatic actions are successful, or if rack device manager 100 determines that an airflow deficiency is likely a result of a physical obstruction, rack device manager 100 may raise an alert in step 6d to cause an administrator to investigate. In some embodiments, if the cooling system is functioning in an optimal manner and all or many rack devices 111 are experiencing airflow deficiencies, rack device manager 100 may use the alert to notify an administrator that the rack devices 111 should be reorganized to avoid excessive heating in a single rack, aisle or room.

As can be seen, rack device manager 100 can take a number of actions automatically to attempt to remediate an airflow deficiency scenario and/or may notify an administrator to provide context and guidance on how to best remediate an airflow deficiency when automatic action may be insufficient or ineffective. By managing airflow deficiency scenarios in this manner, rack device manager 100 can minimize the likelihood of a rack device 111 being damaged due to excessive heating and can also enhance the performance and efficiency of workloads.

In summary, rack device manager 100 may detect an airflow deficiency scenario on a rack device 111 using a comparison between an estimated airflow and net airflow of the rack device, such as by generating a rack device classifier. When rack device manager 100 detects an airflow deficiency scenario, such as when net airflow is less than estimated airflow which could be represented by a rack device classifier having a particular value, it may consider whether neighboring rack devices may be the cause and may take action such as by redistributing workload or applying power caps to attempt to remediate the deficiency. When rack device manager 100 detects airflow deficiency scenarios at many or all of the rack devices 111 in a rack 110, it may recalibrate a cooling system to direct more airflow to the rack and/or may recommend reorganizing the rack devices. If automatic remediation is unsuccessful or inappropriate, rack device manager 100 may alert an administrator to perform manual remediation such as by removing a physical obstruction.

Embodiments of the present invention may comprise or utilize special purpose or general-purpose computers including computer hardware, such as, for example, one or more processors and system memory. Embodiments within the scope of the present invention also include physical and other computer-readable media for carrying or storing computer-executable instructions and/or data structures. Such computer-readable media can be any available media that can be accessed by a general purpose or special purpose computer system.

Computer-readable media are categorized into two disjoint categories: computer storage media and transmission media. Computer storage media (devices) include RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other similar storage medium which can be used to store desired program code means in the form of computer-executable instructions or data structures and which can be accessed by a general purpose or special purpose computer. Transmission media include signals and carrier waves. Because computer storage media and transmission media are disjoint categories, computer storage media does not include signals or carrier waves.

Computer-executable instructions comprise, for example, instructions and data which, when executed by a processor, cause a general-purpose computer, special purpose computer, or special purpose processing device to perform a certain function or group of functions. The computer executable instructions may be, for example, binaries, intermediate format instructions such as assembly language or P-Code, or even source code.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, tablets, smart watches, pagers, routers, switches, and the like.

The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices. An example of a distributed system environment is a cloud of networked servers or server resources. Accordingly, the present invention can be hosted in a cloud environment.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description.

What is claimed:

1. A method for identifying and remediating an airflow deficiency scenario on a rack device, the method comprising:
    detecting that a first rack device in a first rack is experiencing an airflow deficiency scenario;
    determining that a second rack device in the first rack is a neighbor to the first rack device and has excess airflow; and
    automatically performing one or more actions to remediate the airflow deficiency scenario.

2. The method of claim 1, wherein detecting that the first rack device is experiencing the airflow deficiency scenario comprises detecting that a net airflow of the first rack device is less than an estimated airflow for the first rack device.

3. The method of claim 2, wherein the estimated airflow for the first rack device is calculated using a power consumption of the first rack device.

4. The method of claim 3, wherein the estimated airflow for the first rack device is also calculated using an inlet temperature and an exhaust temperature of the first rack device.

5. The method of claim 1, wherein detecting that the first rack device is experiencing the airflow deficiency scenario comprises generating a rack device classifier for the first rack device.

6. The method of claim 5, wherein detecting that the first rack device is experiencing the airflow deficiency scenario comprises determining that the rack device classifier for the first rack device has a classification representing insufficient airflow.

7. The method of claim 6, wherein determining that the second rack device has excess airflow comprises generating a rack device classifier for the second rack device.

8. The method of claim 7, wherein determining that the second rack device has excess airflow comprises determining that the rack device classifier for the second rack device has a classification representing excess airflow.

9. The method of claim 1, wherein automatically performing one or more actions to remediate the airflow deficiency scenario comprises redistributing workload on the first rack device to another rack device.

10. The method of claim 1, wherein automatically performing one or more actions to remediate the airflow deficiency scenario comprises applying a power cap to one or both of the first rack device or the second rack device.

11. The method of claim 1, wherein automatically performing one or more actions to remediate the airflow deficiency scenario comprises recalibrating a cooling system.

12. The method of claim 1, further comprising:
generating an alert to notify an administrator of the airflow deficiency scenario.

13. One or more computer storage media storing computer executable instructions which when executed implement a method for identifying and remediating an airflow deficiency scenario on a rack device, the method comprising:
obtaining airflow metrics from a plurality of rack devices in a rack;
generating a rack device classifier for each of the plurality of rack devices based on the respective airflow metrics;
identifying an airflow deficiency scenario on at least one of the plurality of rack devices based on the respective rack device classifier; and
performing one or more actions to automatically remediate the airflow deficiency scenario.

14. The computer storage media of claim 13, wherein generating the rack device classifier for each of the plurality of rack devices based on the respective airflow metrics comprises calculating an estimated airflow for each of the plurality of devices.

15. The computer storage media of claim 13, wherein performing the one or more actions to automatically remediate the airflow deficiency scenario comprises one or more of:
redistributing workload on the at least one of the plurality of rack devices; or
applying one or more power caps to the plurality of rack devices.

16. The computer storage media of claim 15, wherein applying the one or more power caps to the plurality of rack devices comprises applying a power cap to a neighboring rack device that has excess airflow.

17. A system for identifying and remediating an airflow deficiency scenario on a rack device, the system comprising:
one or more processors; and
one or more computer storage media storing computer executable instructions which when executed by the one or more processors implement a method for identifying and remediating an airflow deficiency scenario on a rack device, the method comprising:
generating a rack device classifier for each of the plurality of rack devices in a rack;
determining that the rack device classifier generated for a first rack device of the plurality of rack devices is indicative of an airflow deficiency scenario;
determining that a second rack device of the plurality of rack devices is a neighbor of the first rack device; and
performing one or more actions on the second rack device to automatically remediate the airflow deficiency scenario.

18. The system of claim 17, wherein the one or more actions comprise applying a power cap to the second rack device.

19. The system of claim 18, wherein the power cap is applied to the second rack device in response to determining that the second rack device hosts a workload that does not have a high priority.

20. The system of claim 17, wherein the method further comprises:
performing one or more actions on the first rack device to automatically remediate the airflow deficiency scenario.

* * * * *